United States Patent
Nguyen et al.

(10) Patent No.: US 12,380,932 B2
(45) Date of Patent: Aug. 5, 2025

(54) ROW DECODER AND ROW ADDRESS SCHEME IN A MEMORY SYSTEM

(71) Applicant: Silicon Storage Technology, Inc., San Jose, CA (US)

(72) Inventors: Kha Nguyen, Ho Chi Minh (VN); Anh Ly, San Jose, CA (US); Hieu Van Tran, San Jose, CA (US); Hien Pham, Ho Chi Minh (VN); Henry Tran, Ho Chi Minh (VN)

(73) Assignee: Silicon Storage Technology, Inc., San Jose, CA (US)

( * ) Notice: Subject to any disclaimer, the term of this patent is extended or adjusted under 35 U.S.C. 154(b) by 198 days.

(21) Appl. No.: 18/206,488

(22) Filed: Jun. 6, 2023

(65) Prior Publication Data

US 2024/0339136 A1  Oct. 10, 2024

Related U.S. Application Data

(60) Provisional application No. 63/457,751, filed on Apr. 6, 2023.

(51) Int. Cl.
  *G11C 7/10*   (2006.01)
  *G11C 7/12*   (2006.01)

(52) U.S. Cl.
  CPC .............. *G11C 7/1039* (2013.01); *G11C 7/12* (2013.01)

(58) Field of Classification Search
  CPC ........... G11C 7/1039; G11C 7/12; G11C 8/12; G11C 5/025; G11C 8/10; G11C 16/08

USPC ....................................... 365/230.03, 230.06
  See application file for complete search history.

(56) References Cited

U.S. PATENT DOCUMENTS

| | | | |
|---|---|---|---|
| 5,029,130 A * | 7/1991 | Yeh | H10D 64/035 365/186 |
| 5,278,785 A * | 1/1994 | Hazani | G11C 11/5642 365/185.21 |
| 5,815,458 A * | 9/1998 | Chevallier | G11C 8/08 365/230.01 |
| 5,873,112 A * | 2/1999 | Norman | G11C 16/10 257/E27.103 |
| 5,943,283 A * | 8/1999 | Wong | G06F 21/79 365/230.01 |
| 6,034,889 A * | 3/2000 | Mani | G06F 21/79 365/185.32 |

(Continued)

OTHER PUBLICATIONS

PCT Search Report & Written Opinion mailed on Jan. 4, 2024 corresponding to the related PCT Patent Application No. PCT/US2023/024738.

(Continued)

*Primary Examiner* — Michael T Tran
(74) *Attorney, Agent, or Firm* — VEDDER PRICE P.C.

(57) ABSTRACT

Numerous examples are disclosed of a row address decoding scheme. In one example, a memory system comprises m banks of non-volatile memory cells, the m banks respectively comprising n or fewer sectors and the sectors respectively comprising p rows, and a row decoder to receive a row address comprising r bits and to identify (i) a row using the least significant t bits in the r bits, (ii) a bank using the next u least significant bits, and (iii) a sector using the next v least significant bits, where $m \leq 2^u$, $n \leq 2^v$, and $p \leq 2^t$.

20 Claims, 11 Drawing Sheets

Address Decoding Method
1100

1101 receiving, by row decoder 1002, a row address comprising *r* bits;

1102 identifying, by the row decoder, a row within *p* rows of non-volatile memory cells in a logical array formed by *m* banks using the least significant *t* bits in the *r* bits, a bank within the *m* banks using the next *u* least significant bits in the *r* bits, and a sector within *n* sectors within a bank using the next *v* least significant bits, where $m \leq 2^u$, $n \leq 2^v$, and $p \leq 2^t$

(56) References Cited

U.S. PATENT DOCUMENTS

| | | | | |
|---|---|---|---|---|
| 6,160,777 | A * | 12/2000 | Kim | G11B 27/3027 369/47.36 |
| 6,747,310 | B2 * | 6/2004 | Fan | H10D 30/6892 257/E27.103 |
| 7,079,422 | B1 * | 7/2006 | Wong | G11C 11/5628 365/185.25 |
| 9,601,183 | B1 * | 3/2017 | Kajigaya | G11C 5/025 |
| 9,921,763 | B1 * | 3/2018 | Zitlaw | G11C 7/22 |
| 2002/0103959 | A1 * | 8/2002 | Baker, Jr. | G11C 16/3427 711/E12.079 |
| 2004/0181643 | A1 * | 9/2004 | Micheloni | G11C 7/22 711/167 |
| 2006/0081944 | A1 * | 4/2006 | Madan | G11C 11/22 257/390 |
| 2007/0091784 | A1 * | 4/2007 | Ando | G11B 20/10 369/275.4 |
| 2009/0175081 | A1 * | 7/2009 | Kim | G11C 16/16 365/185.11 |
| 2010/0306482 | A1 | 12/2010 | Kim | |
| 2013/0235667 | A1 * | 9/2013 | Nam | G11C 16/0483 365/185.05 |
| 2016/0358640 | A1 * | 12/2016 | Brederlow | G11C 11/221 |
| 2018/0033467 | A1 * | 2/2018 | Villa | G11C 8/16 |
| 2020/0027497 | A1 * | 1/2020 | Shin | G11C 11/4087 |
| 2020/0105774 | A1 * | 4/2020 | Penumatcha | G11C 11/221 |
| 2020/0342942 | A1 * | 10/2020 | Joe | H10B 41/27 |
| 2021/0020232 | A1 * | 1/2021 | Bayat | G01R 19/0038 |
| 2021/0112372 | A1 * | 4/2021 | Aleman | H04W 4/80 |
| 2021/0407580 | A1 * | 12/2021 | Yang | G11C 16/02 |
| 2022/0270703 | A1 * | 8/2022 | Chandramani | G11C 11/5671 |
| 2022/0310172 | A1 * | 9/2022 | O'Toole | G06F 11/10 |

OTHER PUBLICATIONS

Taiwanese Office Action mailed on Nov. 25, 2025 corresponding to the related Taiwanese Patent Application No. 113111114. (Google English translations and original copy of the Taiwanese Office Action are attached.).

* cited by examiner

ROW DECODER AND ROW ADDRESS SCHEME IN A MEMORY SYSTEM

PRIORITY CLAIM

This application claims priority from U.S. Provisional Patent Application No. 63/457,751, filed on Apr. 6, 2023, and titled, "Row Address Decoding Scheme for Memory Banks Comprising Any Number of Sectors," which is incorporated by reference herein.

FIELD OF THE INVENTION

Numerous examples are disclosed of a row address decoding scheme that uniquely identifies each row in a memory system by bank, sector, and row within the sector.

BACKGROUND OF THE INVENTION

The prior art includes non-volatile memories. For example, U.S. Pat. No. 5,029,130 ("the '130 patent"), which is incorporated herein by reference, discloses an array of split-gate non-volatile memory cells, which are a type of flash memory cells. Such a memory cell 110 is shown in FIG. 1. Each memory cell 110 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 110 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 110 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 110 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE NO. 1

Operation of Flash Memory Cell 110 of FIG. 1

|  | WL | BL | SL |
|---|---|---|---|
| Read | 2-3 V | 0.6-2 V | 0 V |
| Erase | ~11-13 V | 0 V | 0 V |
| Program | 1-2 V | 10.5-3 µA | 9-10 V |

Other split-gate memory cell configurations, which are other types of flash memory cells, are available in the prior art. For example, FIG. 2 depicts a four-gate memory cell 210 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,210, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 210 for performing read, erase, and program operations:

TABLE NO. 2

Operation of Flash Memory Cell 210 of FIG. 2

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 µA | 8-11 V | 4.5-9 V | 4.5-5 V |

FIG. 3 depicts a three-gate memory cell 310, which is another type of split-gate flash memory cell. Memory cell 310 is identical to the memory cell 210 of FIG. 2 except that memory cell 310 does not have a separate control gate. The erase operation (whereby erasing occurs through use of the erase gate) and read operation are similar to that of the FIG. 2 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 310 for performing read, erase, and program operations:

TABLE NO. 3

Operation of Flash Memory Cell 310 of FIG. 3

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 µA | 4.5 V | 7-9 V |

FIG. 4 depicts stacked-gate memory cell 410, which is another type of flash memory cell. Memory cell 410 is similar to memory cell 110 of FIG. 1, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 110 with a higher control gate voltage.

Table No. 4 depicts typical voltage ranges that can be applied to the terminals of memory cell 410 and substrate 12 for performing read, erase, and program operations:

TABLE NO. 4

Operation of Flash Memory Cell 410 of FIG. 4

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split-gate flash or stacked-gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

Non-volatile memory cells are arranged into an array comprising rows and columns of non-volatile memory cells. In a simple configuration, a single physical array contains all of the non-volatile memory cells of the memory system and is coextensive with a logical array that is presented to components outside of the memory system, such as a CPU that utilizes the memory system. In a more complex configuration, multiple physical arrays are used and contain the non-volatile memory cells of the memory system. In this situation, a logical array can be mapped to the multiple physical arrays.

In yet another configuration, multiple banks are used and contain the non-volatile memory cells of the memory system. A bank can include a single physical array or multiple physical arrays. By dividing a logical array among different banks instead of using a single physical array, the overall speed of the system can be increased, the overall leakage of the memory system can be reduced to enhance the margin for read or program operations (since read or program operations will be less affected by memory cell leakage), and the parasitic capacitances can be reduced, with the downside of requiring additional address decoding as some portion of the address will be allocated to identifying the bank for an operation.

FIG. 5 depicts prior art memory system 500. Memory system 500 comprises logical array 550 that is formed of banks 501, 502, 503, and 504. In one example, logical array 550 can store 8 Mb of data. In this example, banks 501, 502, 503, and 504 respectively store 2 Mb of data and comprises 512 rows and 4096 bitlines.

With reference to FIG. 6, prior art banks 501, 502, 503, and 504 can comprise sectors. In this example, banks 501, 502, 503, and 504 respectively comprises N+1 sectors, referred to as sector 0, sector 1, . . . , sector (N−1), and sector N. Respective sectors comprise two or more consecutive rows of memory cells in the bank.

FIG. 7 depicts prior art memory system 700. Memory system 700 comprises logical array 750 formed of banks 701, 702, 703, and 704. Memory system 700 further comprises column multiplexors 705, 706, 707, and 708; sense amplifiers and column drivers 709 and 710; high voltage (HV) decoders and latches 712, 713, 714, and 715; and row decoders 711 and 712. Banks 701, 702, 703, and 704 form a logical array of non-volatile memory cells arranged into rows and columns. Column multiplexor 705 operates on columns of bank 701, column multiplexor 706 operates on columns of bank 702, column multiplexor 707 operates on columns of bank 703, and column multiplexor 708 operates on columns of bank 704. Row decoder 711 operates on rows of banks 701 and 702, and row decoder 712 operates on rows of bank 703 and 704. Sense amplifier and column drivers 709 performs sense operations on outputs received from column multiplexors 705 and 707 during read operations (that is, to read the "1's" or "0's" stored in the memory cells) and controls current applied to the columns of bank 701 and 703 through column multiplexors 705 and 707 during programming operations. Sense amplifier and column drivers 710 performs sense operations on outputs received from column multiplexors 706 and 708 during read operations and controls current applied to the columns of bank 702 and 704 through column multiplexors 706 and 708 during programming operations. HV decoders and latches 712, 713, 714, and 715 provide high voltages to the rows of banks 701, 702, 703, and 704, respectively, for example, during program or erase operations.

Prior art systems allocate a number of rows in logical array 750 to each bank 701, 702, 703, and 704 where the number of rows is a power of 2, i.e., $2^n$, where n is an integer and is the number of address bits required to decode any particular row in a bank. For example, if logical array can store 32 Mb, logical array 750 might comprise 8192 rows× 4096 columns, which can be partitioned into 16 banks (where other banks, not shown, in addition to banks 701, 702, 703, and 704 are used) of 512 rows×4096 bitlines per bank, where $512=2^9$ and n=9. In this example, the row address would require 13 address bits, XA[12:0], of which the bank address would require 4 of those bits, such as XA[12:9] (indicating bits in bit locations 12, 11, 10, and 9 within the 13 address bits, where the bit locations span bit location 12 to bit location 0), to distinguish among 16 different banks. Here the total number of rows is $512*16=8192=2^{13}$. Banks 701, 702, 703, and 704 optionally comprise sectors.

In a simpler example involving 16 rows, the 16 rows can be divided among 4 banks according to the addressing scheme shown in Table No. 5:

TABLE NO. 5

Bank Allocation for 16 Rows

| XA[3] | XA[2] | XA[1] | XA[0] | Row # | Bank # |
|---|---|---|---|---|---|
| 0 | 0 | 0 | 0 | 0 | 0 |
| 0 | 0 | 0 | 1 | 1 | 0 |
| 0 | 0 | 1 | 0 | 2 | 0 |
| 0 | 0 | 1 | 1 | 3 | 0 |
| 0 | 1 | 0 | 0 | 4 | 1 |

TABLE NO. 5-continued

Bank Allocation for 16 Rows

| XA[3] | XA[2] | XA[1] | XA[0] | Row # | Bank # |
|---|---|---|---|---|---|
| 0 | 1 | 0 | 1 | 5 | 1 |
| 0 | 1 | 1 | 0 | 6 | 1 |
| 0 | 1 | 1 | 1 | 7 | 1 |
| 1 | 0 | 0 | 0 | 8 | 2 |
| 1 | 0 | 0 | 1 | 9 | 2 |
| 1 | 0 | 1 | 0 | 10 | 2 |
| 1 | 0 | 1 | 1 | 11 | 2 |
| 1 | 1 | 0 | 0 | 12 | 3 |
| 1 | 1 | 0 | 1 | 13 | 3 |
| 1 | 1 | 1 | 0 | 14 | 3 |
| 1 | 1 | 1 | 1 | 15 | 3 |

In the example of Table No. 5, because the number of rows in each bank is a power of 2 (i.e., $2^n$), the two most significant bits (MSB) in the row address, XA[3] and XA[2], can be used as a bank identifier, with XA[3:2]=00 indicating bank 0, XA[3:2]=01 indicating bank 1, XA[3:2]=10 indicating bank 2, and XA[3:2]=11 indicating bank 3. In this manner, the row address can very quickly be decoded to identify the appropriate bank for a read, program, or erase operation. If the banks respectively contain sectors formed of two rows per sector, then XA[1] can be used to identify within a particular bank, and XA[0] can be used to identify a row within a particular sector. However, if the sectors are formed of a different number of rows, such as three rows, then this scheme will not work, nor will the scheme work if the banks contain different numbers of sectors.

This approach will not work if the number of rows allocated to a bank is not a power of 2 (i.e., $2^n$), because in that situation bank identification will not neatly correspond to a number of bits in the row address. Also, this approach will not work if the total number of rows is not equal to the $2^r$, where r is the number of row address bits, for example, if r=9 but the total number of rows is 510 and not 512 (i.e., $2^9$). For example, in the example of Table No. 5, if each bank was instead allocated 6 rows, the addressing scheme shown in Table No. 5 would not work to uniquely identify each bank and row. Moreover, it is desirable for any address decoding scheme to keep rows of a sector in the same bank, as sectors comprise rows that are physically consecutive with one another, which adds to the challenge. For example, a sector might have a number of rows that is a multiple of 2 because 2 consecutive rows share one or more of erase gate lines and control gate lines.

Table No. 6 depicts an example where 36 rows are allocated among 4 banks. Notably, 36 is not a power of 2. In this example, banks 0 and 1 have 10 rows each, and banks 2 and 3 have 8 rows each. With such a scheme, the prior art row decoding scheme will not suffice. Prior art systems therefore might use combinatorial logic on the 4 or 5 most significant bits in the row address to identify the bank for a particular row. For example, bank 3 can be indicated by XA[5:2]=[0111] OR [1100], bank 2 can be indicated by XA[5:2]=[0101] OR [0110], bank 1 can be indicated by XA[5:1]=[00101] OR XA[5:2]=[0011] OR [0100], and bank 0 can be indicated by XA[5:1]=[0000] OR [0001] OR [00100]. The combinatorial logic required to perform this decoding function will be complex and will require significant die space.

TABLE NO. 6

Bank Allocation for 36 Rows

| XA[5] | XA[4] | XA[3] | XA[2] | XA[1] | XA[0] | Row # | Bank # |
|---|---|---|---|---|---|---|---|
| 0 | 0 | 0 | 0 | 0 | 0 | 0 | 0 |
| 0 | 0 | 0 | 0 | 0 | 1 | 1 | 0 |
| 0 | 0 | 0 | 0 | 1 | 0 | 2 | 0 |
| 0 | 0 | 0 | 0 | 1 | 1 | 3 | 0 |
| 0 | 0 | 0 | 1 | 0 | 0 | 4 | 0 |
| 0 | 0 | 0 | 1 | 0 | 1 | 5 | 0 |
| 0 | 0 | 0 | 1 | 1 | 0 | 6 | 0 |
| 0 | 0 | 0 | 1 | 1 | 1 | 7 | 0 |
| 0 | 0 | 1 | 0 | 0 | 0 | 8 | 0 |
| 0 | 0 | 1 | 0 | 0 | 1 | 9 | 0 |
| 0 | 0 | 1 | 0 | 1 | 0 | 10 | 1 |
| 0 | 0 | 1 | 0 | 1 | 1 | 11 | 1 |
| 0 | 0 | 1 | 1 | 0 | 0 | 12 | 1 |
| 0 | 0 | 1 | 1 | 0 | 1 | 13 | 1 |
| 0 | 0 | 1 | 1 | 1 | 0 | 14 | 1 |
| 0 | 0 | 1 | 1 | 1 | 1 | 15 | 1 |
| 0 | 1 | 0 | 0 | 0 | 0 | 16 | 1 |
| 0 | 1 | 0 | 0 | 0 | 1 | 17 | 1 |
| 0 | 1 | 0 | 0 | 1 | 0 | 18 | 1 |
| 0 | 1 | 0 | 0 | 1 | 1 | 19 | 1 |
| 0 | 1 | 0 | 1 | 0 | 0 | 20 | 2 |
| 0 | 1 | 0 | 1 | 0 | 1 | 21 | 2 |
| 0 | 1 | 0 | 1 | 1 | 0 | 22 | 2 |
| 0 | 1 | 0 | 1 | 1 | 1 | 23 | 2 |
| 0 | 1 | 1 | 0 | 0 | 0 | 24 | 2 |
| 0 | 1 | 1 | 0 | 0 | 1 | 25 | 2 |
| 0 | 1 | 1 | 0 | 1 | 0 | 26 | 2 |
| 0 | 1 | 1 | 0 | 1 | 1 | 27 | 2 |
| 0 | 1 | 1 | 1 | 0 | 0 | 28 | 3 |
| 0 | 1 | 1 | 1 | 0 | 1 | 29 | 3 |
| 0 | 1 | 1 | 1 | 1 | 0 | 30 | 3 |
| 0 | 1 | 1 | 1 | 1 | 1 | 31 | 3 |
| 1 | 0 | 0 | 0 | 0 | 0 | 32 | 3 |
| 1 | 0 | 0 | 0 | 0 | 1 | 33 | 3 |
| 1 | 0 | 0 | 0 | 1 | 0 | 34 | 3 |
| 1 | 0 | 0 | 0 | 1 | 1 | 35 | 3 |

If the banks respectively contain sectors formed of two rows per sector, then XA[1] can be used to identify within a particular bank, and XA[0] can be used to identify a row within a particular sector. However, if the sectors are formed of a different number of rows, such as three rows, then this scheme will not work, nor will the scheme work if the banks contain different numbers of sectors.

A new address decoding scheme is desirable where the scheme is able to handle situations where the number of rows assigned to a bank is not a power of 2 and where the scheme keeps rows of a sector in the same bank.

SUMMARY OF THE INVENTION

Numerous examples are disclosed of a row address decoding scheme that uniquely identifies each row in a memory system by bank, sector, and row within the sector. The row addressing schemes described herein can handle situations where the number of sectors is either odd or even, where banks contain either odd or even numbers of sectors, and where the number of total rows in a bank are either a power of 2 or are not a power of 2.

DETAILED DESCRIPTION OF THE INVENTION

In the examples described herein, a row address comprises a plurality of bits, where a first set of bits are used to identify a bank, a second set of bits are used to identify a sector within a bank, and a third set of bits are used to identify a row within a sector, but unlike in the prior art, the addressing schemes described herein can handle situations where the number of sectors is either odd or even, where banks contain either odd or even numbers of sectors, and where the number of total rows in a bank are either a power of 2 or are not a power of 2.

Figure 8:
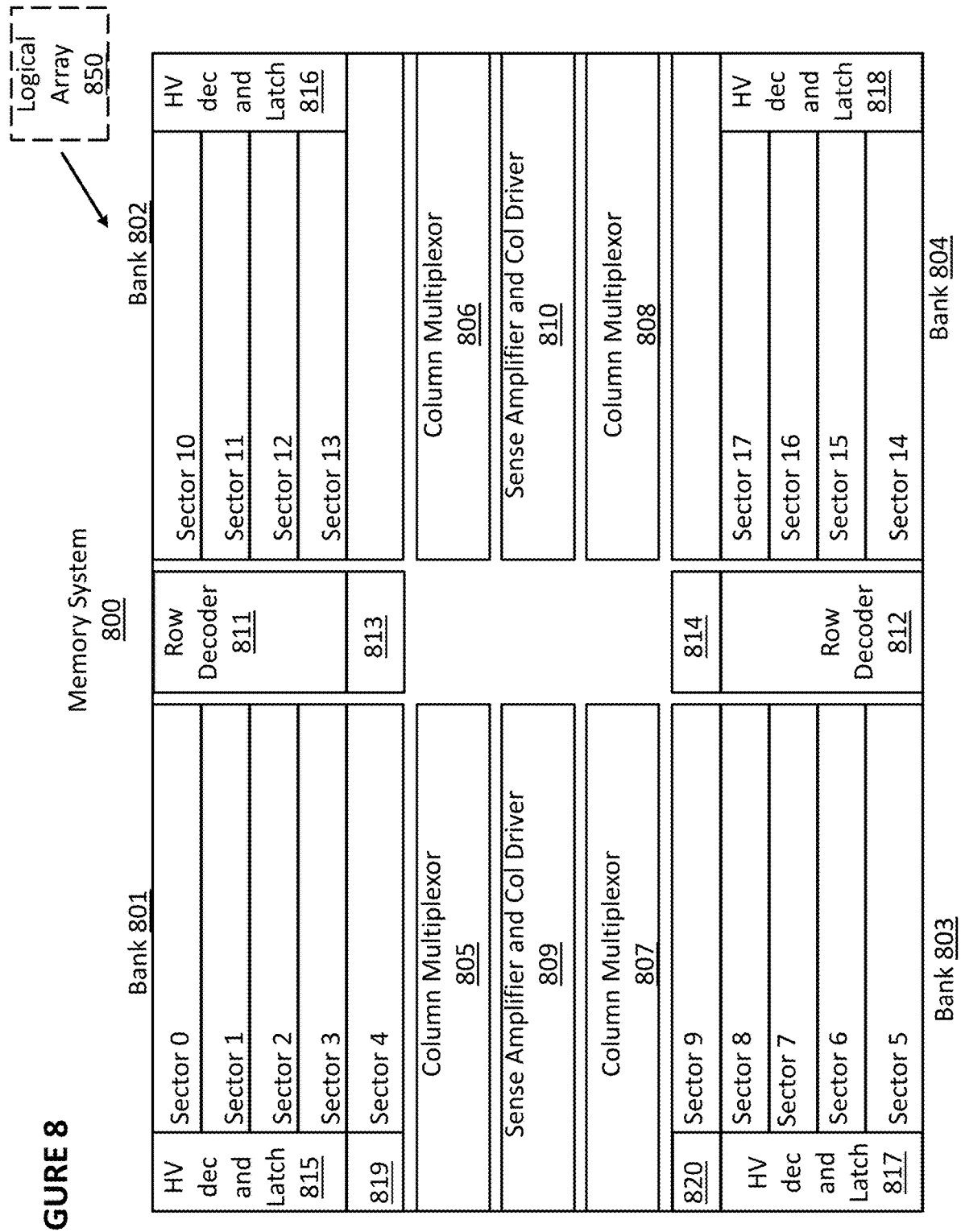
FIG. 8 depicts a memory system comprising a plurality of banks.

FIG. 8 depicts an example memory system where one or more banks comprise an even number of sectors, one or more banks comprise an odd number of sectors, the banks contain different numbers of sectors, and the memory system comprises a total number of rows that is not a power of 2. In this example, there are 4 banks and 18 sectors, with each sector containing 2 rows. Here, banks 801 and 803 are respectively allocated 5 sectors, and banks 802 and 804 are respectively allocated 4 sectors. Because each sector has 2 rows, the least significant bit, XA[0], will be used to decode the row within each sector. That is, because a sector contains two rows, XA[0]=0 will indicate one row and XA[0]=1 will indicate the other row.

Figure 1:
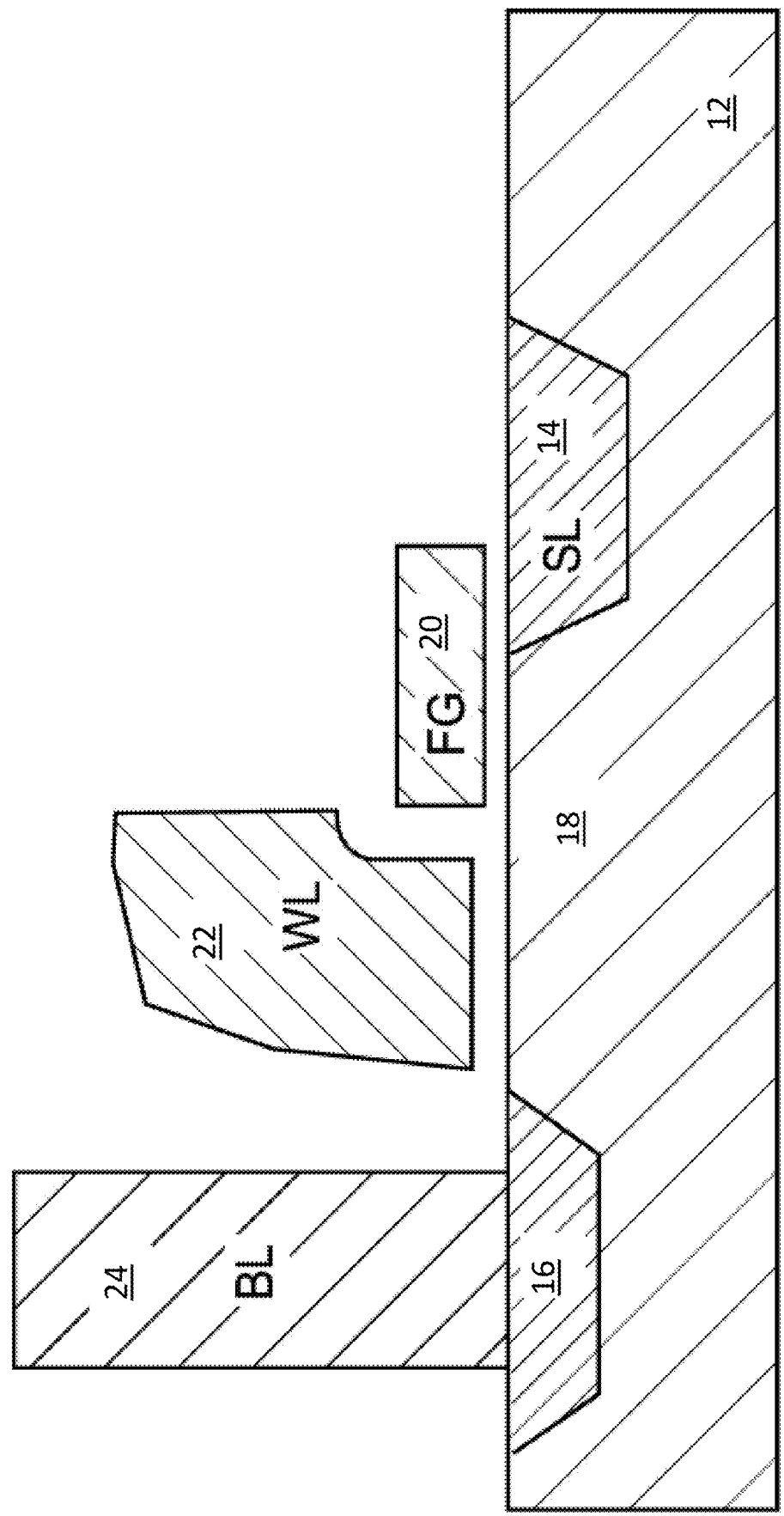
FIG. 1 depicts a prior art split-gate flash memory cell.
Figure 2:
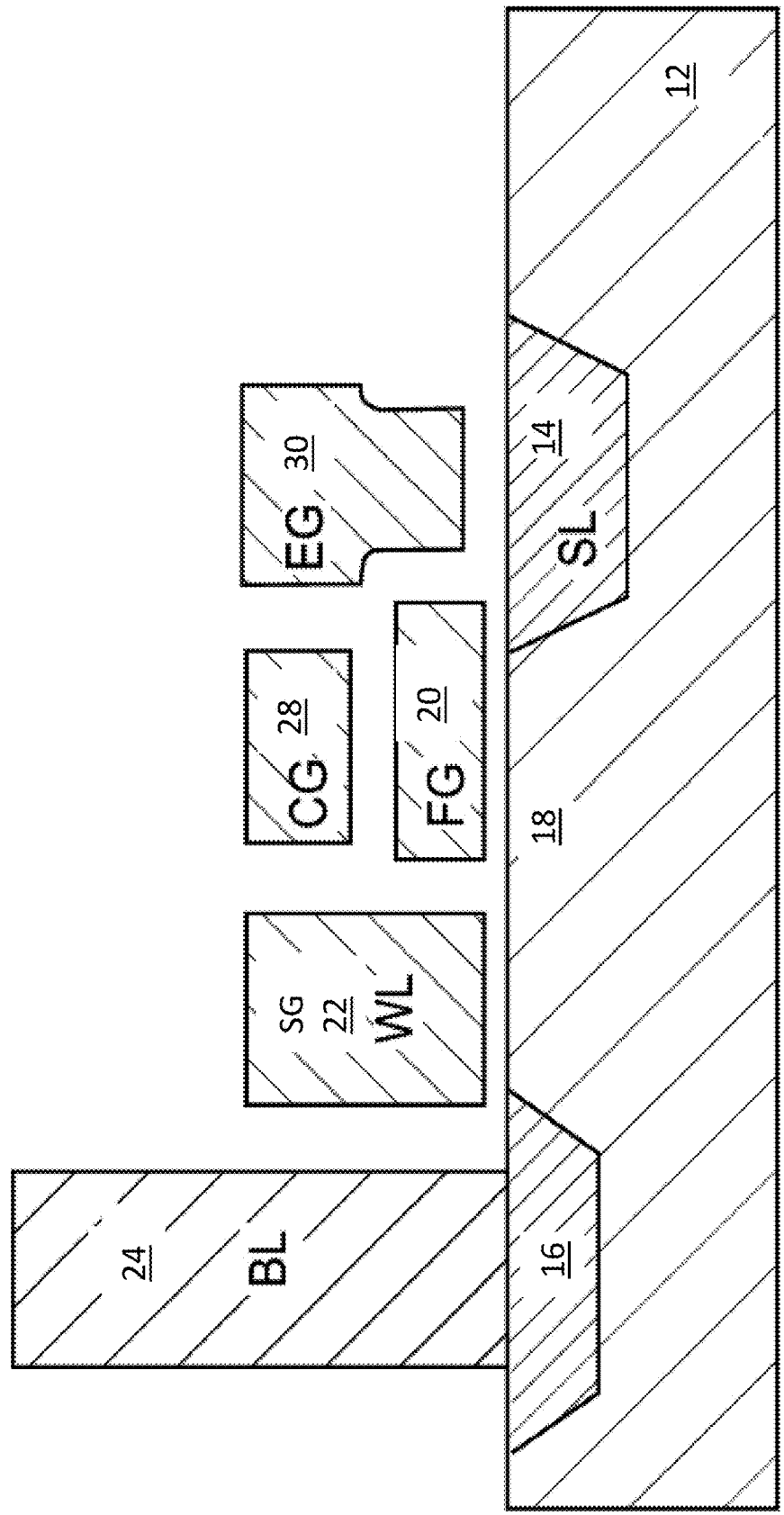
FIG. 2 depicts another prior art split-gate flash memory cell.
Figure 3:
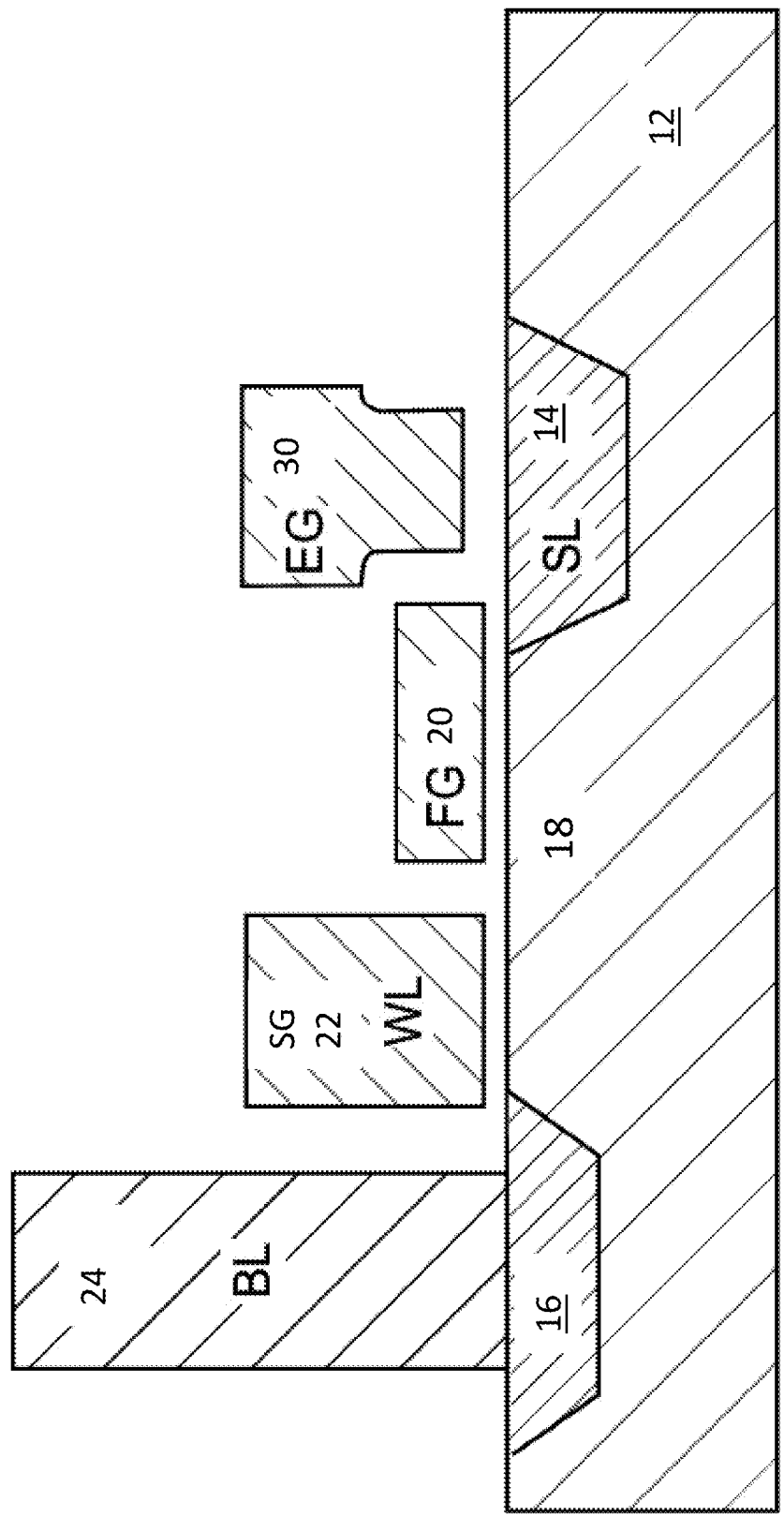
FIG. 3 depicts another prior art split-gate flash memory cell.
Figure 4:
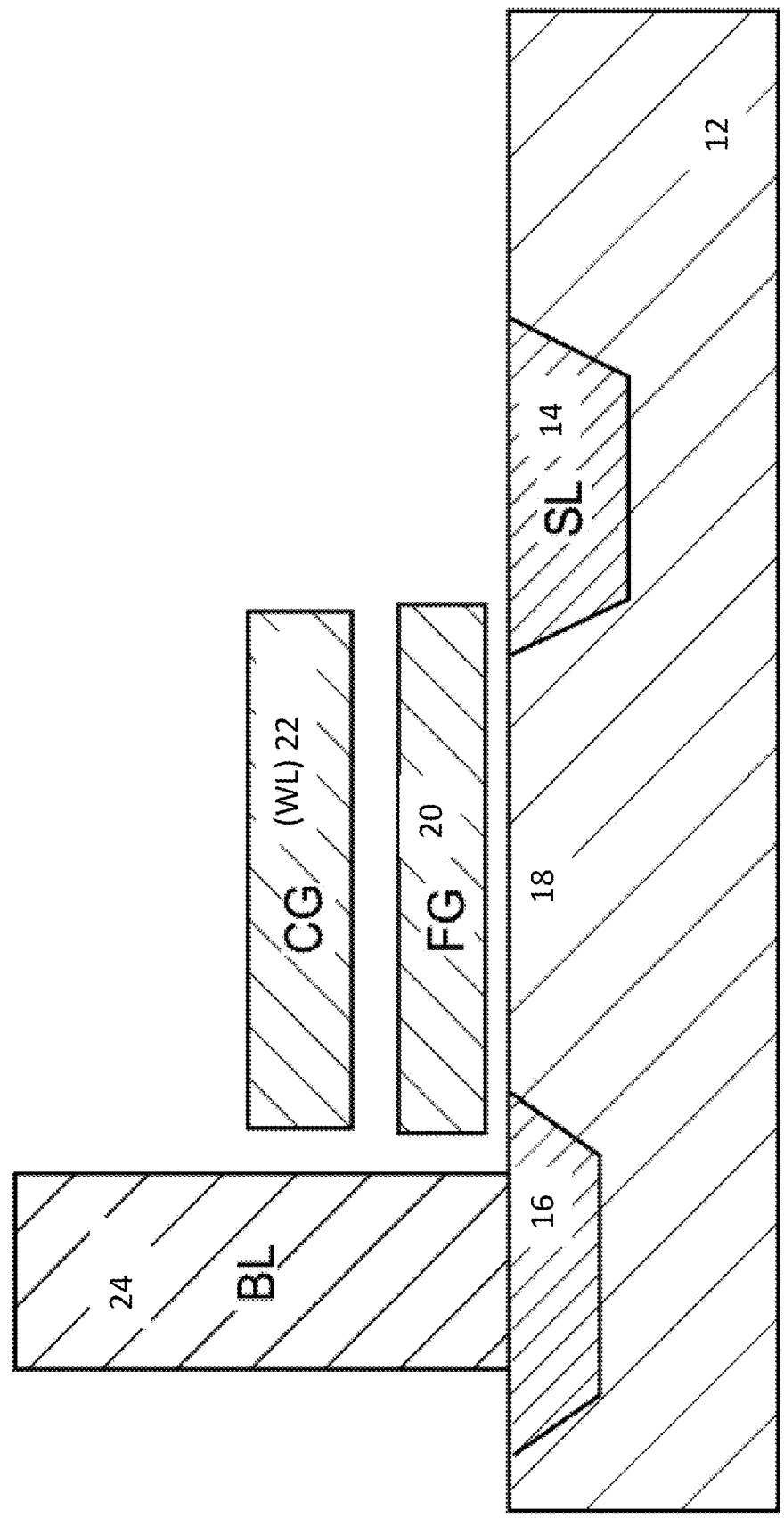
FIG. 4 depicts a prior art stacked-gate flash memory cell.
Figure 5:
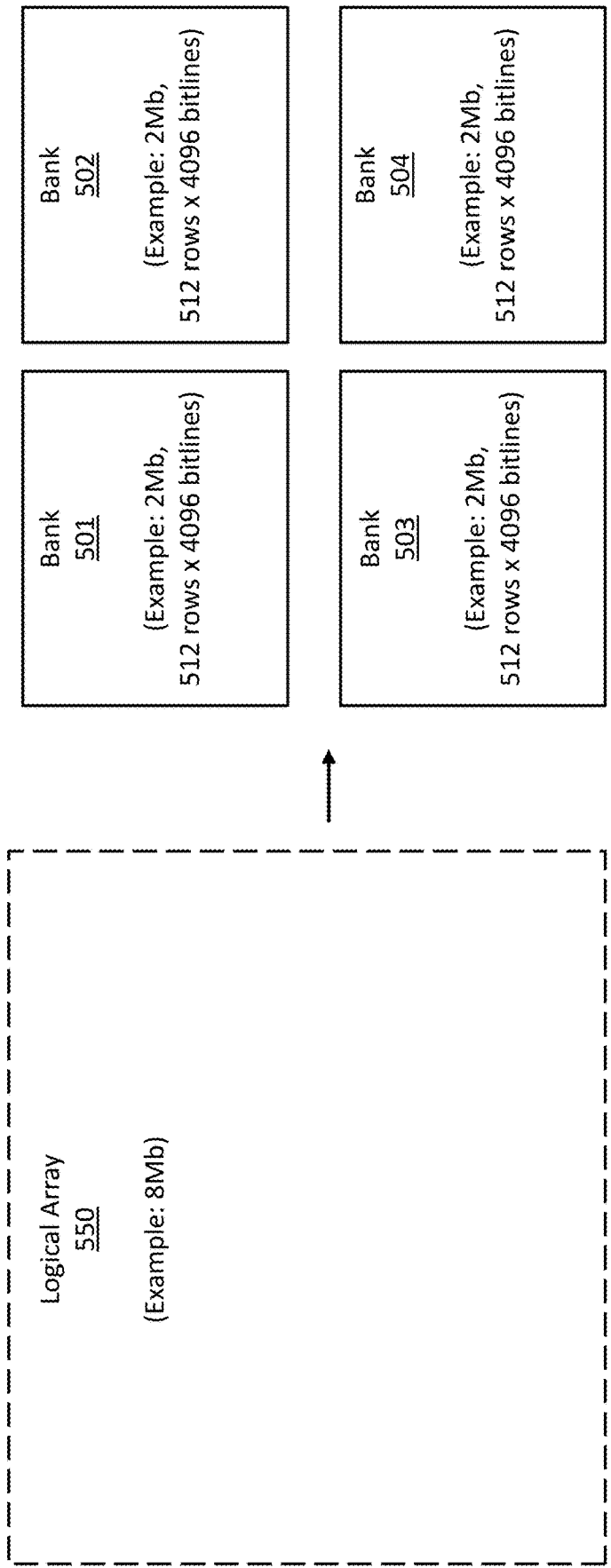
FIG. 5 depicts a memory system comprising a logical array stored in a plurality of banks.
Figure 6:
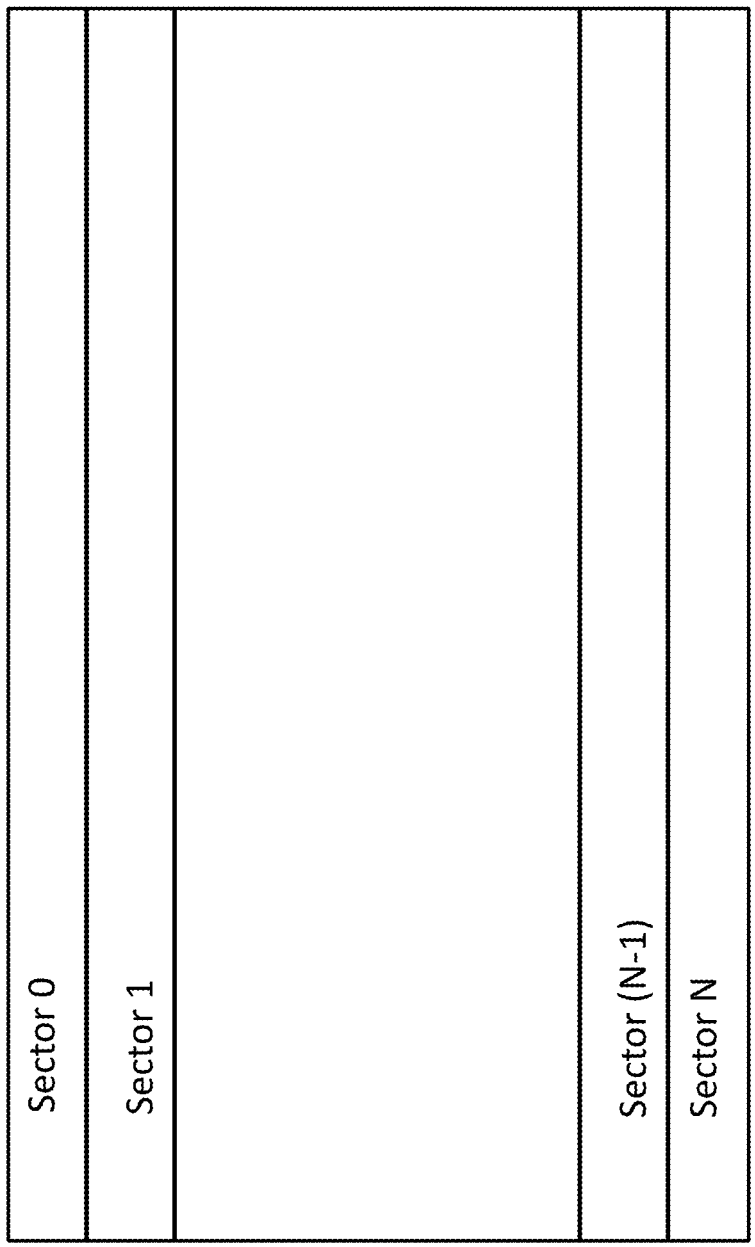
FIG. 6 depicts components of the memory system of FIG. 5.
Figure 7:
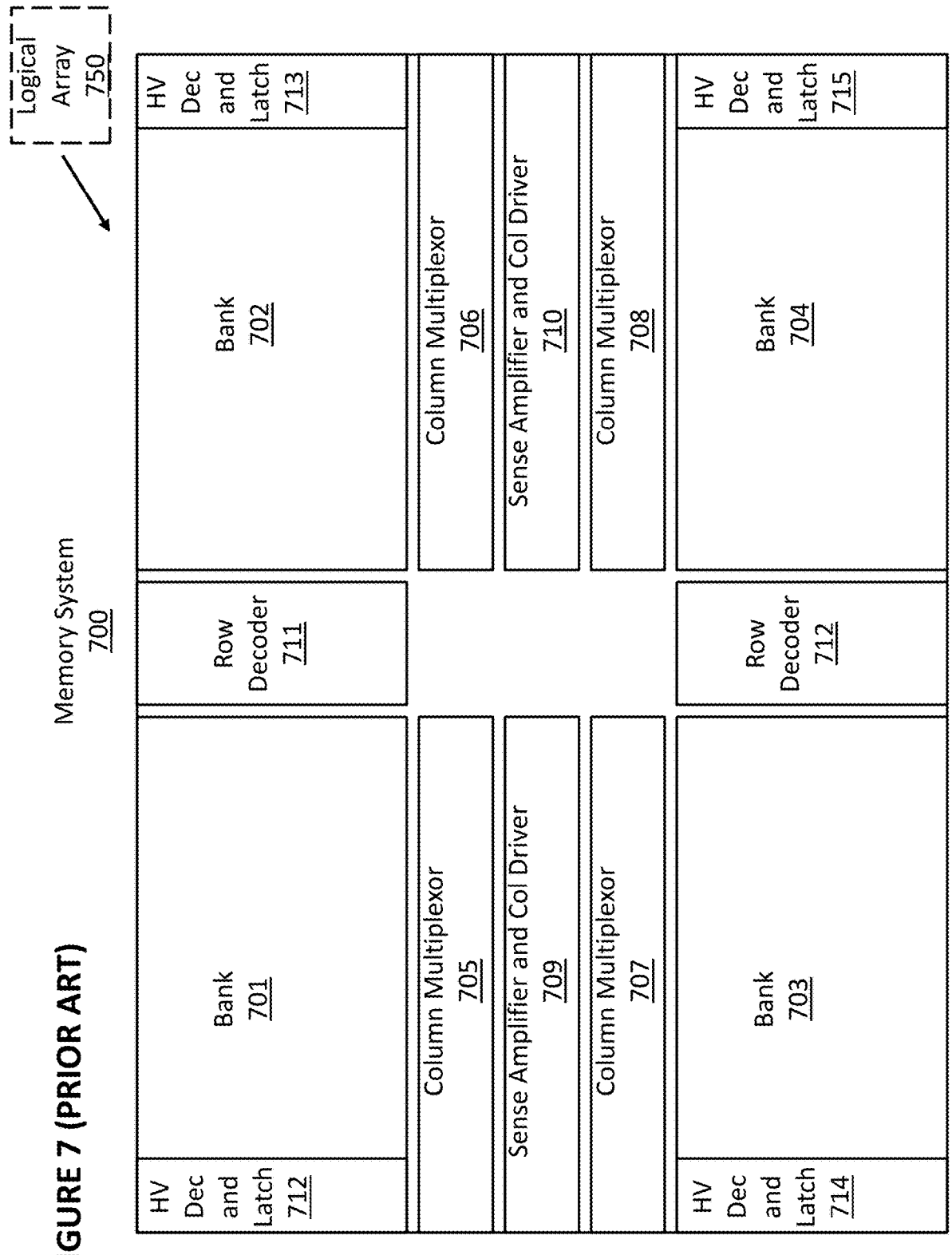
FIG. 7 depicts a bank comprising a plurality of sectors.

Memory system 800 comprises logical array 850 formed of banks 801, 802, 803, and 804. Memory system 800 further comprises column multiplexors 805, 806, 807, and 808; sense amplifiers and column drivers 809 and 810; row decoders 811, 812, 813, and 814; and high voltage decoders and latches 815, 816, 817, 818, 819, and 820. Banks 801, 802, 803, and 804 respectively comprise an array of non-volatile memory cells arranged into rows and columns. The non-volatile memory cells can be split-gate flash memory cells such as memory cells 110, 210, and 310 in FIGS. 1, 2, and 3, respectively, or stacked-gate flash memory cells such as memory cell 410 in FIG. 4. Bank 801 comprises sectors 0, 1, 2, 3, and 4; bank 802 comprises sectors 10, 11, 12, and 13; bank 803 comprises sectors 5, 6, 7, 8, and 9; and bank 804 comprises sectors 14, 15, 16, and 17. In FIG. 8, the sector numbers are global sector numbers, meaning a unique number identifying a sector among all sectors in all banks.

Column multiplexor 805 operates on columns of bank 801, column multiplexor 806 operates on columns of bank 802, column multiplexor 807 operates on columns of bank 803, and column multiplexor 808 operates on columns of bank 804.

Row decoder 811 operates on the rows of bank 801 corresponding to sectors 0, 1, 2, and 3 and on the rows of bank 802 corresponding to sectors 10, 11, 12, and 13; row decoder 813 operates on the rows of bank 801 corresponding to sector 4; row decoder 812 operates on the rows of bank 803 corresponding to sectors 5, 6, 7, and 8 and on the rows of bank 804 corresponding to sectors 14, 15, 16, and 17; and row decoder 814 operates on the rows of bank 803 corresponding to sector 9.

Sense amplifier and column driver 809 performs sense operations on outputs received from column multiplexors 805 and 807 during read operations and controls current applied to the columns of bank 801 and 803 through column multiplexors 805 and 807 during programming operations. Sense amplifier and column driver 810 performs sense operations on outputs received from column multiplexors 806 and 808 during read operations and controls current applied to the columns of bank 802 and 804 through column multiplexors 806 and 808 during programming operations.

HV decoder and latch 815 provides high voltages (for example, for program or erase operations) to the rows of bank 801 corresponding to sectors 0, 1, 2, and 3; HV decoder and latch 816 provides high voltages to the rows of bank 802 corresponding to sectors 10, 11, 12, and 13; HV decoder and latch 817 provides high voltages to the rows of bank 803 corresponding to sectors 5, 6, 7, and 8; HV decoder and latch 818 provides high voltages to the rows of bank 804 corresponding to sectors 14, 15, 16, and 17; HV decoder and latch 819 provides high voltages to the rows of bank 801 corresponding to sector 4; and HV decoder and latch 820 provides high voltages to the rows of bank 803 corresponding to sector 9.

Table No. 7 depicts a bank allocation scheme implemented by row decoders 811, 812, 813, and 814 in the example of FIG. 8.

TABLE NO. 7

Bank Allocation for 36 Rows

| XA[5] | XA[4] | XA[3] | XA[2] | XA[1] | XA[0] | Physical Row # | Logical Row # | Sector # Within Bank | Global Sector # | Bank # |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 1 | 1 | 1 | 0 | 0 | 0 |
| 0 | 0 | 1 | 0 | 0 | 0 | 2 | 8 | 1 | 1 | 0 |
| 0 | 0 | 1 | 0 | 0 | 1 | 3 | 9 | 1 | 1 | 0 |
| 0 | 1 | 0 | 0 | 0 | 0 | 4 | 16 | 2 | 2 | 0 |
| 0 | 1 | 0 | 0 | 0 | 1 | 5 | 17 | 2 | 2 | 0 |
| 0 | 1 | 1 | 0 | 0 | 0 | 6 | 24 | 3 | 3 | 0 |
| 0 | 1 | 1 | 0 | 0 | 1 | 7 | 25 | 3 | 3 | 0 |
| 1 | 0 | 0 | 0 | 0 | 0 | 8 | 32 | 4 | 4 | 0 |
| 1 | 0 | 0 | 0 | 0 | 1 | 9 | 33 | 4 | 4 | 0 |
| 0 | 0 | 0 | 0 | 1 | 0 | 10 | 2 | 0 | 5 | 1 |
| 0 | 0 | 0 | 0 | 1 | 1 | 11 | 3 | 0 | 5 | 1 |

TABLE NO. 7-continued

Bank Allocation for 36 Rows

| XA[5] | XA[4] | XA[3] | XA[2] | XA[1] | XA[0] | Physical Row # | Logical Row # | Sector # Within Bank | Global Sector # | Bank # |
|---|---|---|---|---|---|---|---|---|---|---|
| 0 | 0 | 1 | 0 | 1 | 0 | 12 | 10 | 1 | 6 | 1 |
| 0 | 0 | 1 | 0 | 1 | 1 | 13 | 11 | 1 | 6 | 1 |
| 0 | 1 | 0 | 0 | 1 | 0 | 14 | 18 | 2 | 7 | 1 |
| 0 | 1 | 0 | 0 | 1 | 1 | 15 | 19 | 2 | 7 | 1 |
| 0 | 1 | 1 | 0 | 1 | 0 | 16 | 26 | 3 | 8 | 1 |
| 0 | 1 | 1 | 0 | 1 | 1 | 17 | 27 | 3 | 8 | 1 |
| 1 | 0 | 0 | 0 | 1 | 0 | 18 | 34 | 4 | 9 | 1 |
| 1 | 0 | 0 | 0 | 1 | 1 | 19 | 35 | 4 | 9 | 1 |
| 0 | 0 | 0 | 1 | 0 | 0 | 20 | 4 | 0 | 10 | 2 |
| 0 | 0 | 0 | 1 | 0 | 1 | 21 | 5 | 0 | 10 | 2 |
| 0 | 0 | 1 | 1 | 0 | 0 | 22 | 12 | 1 | 11 | 2 |
| 0 | 0 | 1 | 1 | 0 | 1 | 23 | 13 | 1 | 11 | 2 |
| 0 | 1 | 0 | 1 | 0 | 0 | 24 | 20 | 2 | 12 | 2 |
| 0 | 1 | 0 | 1 | 0 | 1 | 25 | 21 | 2 | 12 | 2 |
| 0 | 1 | 1 | 1 | 0 | 0 | 26 | 28 | 3 | 13 | 2 |
| 0 | 1 | 1 | 1 | 0 | 1 | 27 | 29 | 3 | 13 | 2 |
| 0 | 0 | 0 | 1 | 1 | 0 | 28 | 6 | 0 | 14 | 3 |
| 0 | 0 | 0 | 1 | 1 | 1 | 29 | 7 | 0 | 14 | 3 |
| 0 | 0 | 1 | 1 | 1 | 0 | 30 | 14 | 1 | 15 | 3 |
| 0 | 0 | 1 | 1 | 1 | 1 | 31 | 15 | 1 | 15 | 3 |
| 0 | 1 | 0 | 1 | 1 | 0 | 32 | 22 | 2 | 16 | 3 |
| 0 | 1 | 0 | 1 | 1 | 1 | 33 | 23 | 2 | 16 | 3 |
| 0 | 1 | 1 | 1 | 1 | 0 | 34 | 30 | 3 | 17 | 3 |
| 0 | 1 | 1 | 1 | 1 | 1 | 35 | 31 | 3 | 17 | 3 |

In the example of Table NO. 7, XA[2:1] is used to identify the bank, XA[5:3] is used to identify the sector within the bank (where each sector within a bank is also assigned a global sector number that is a sector number across all banks), and XA[0] is used to identify the row within the sector. Notably, no additional combinatorial logic is required to identify a bank from the row address; the decoding is performed by row decoders 811, 812, 813, and 814.

Figure 9:
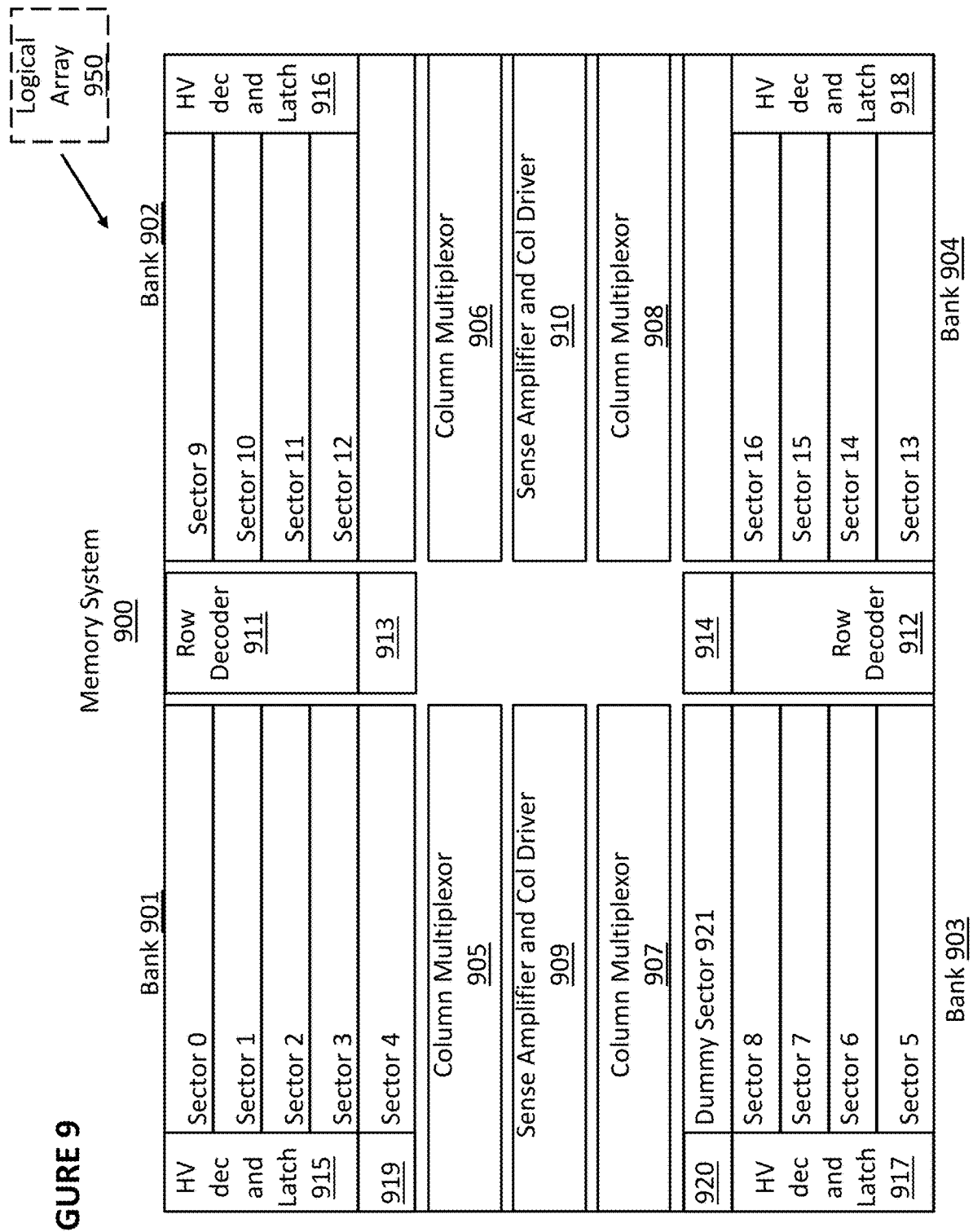
FIG. 9 depicts another memory system comprising a plurality of banks.

FIG. 9 depicts an example memory system where one or more banks comprise an even number of sectors, one or more banks comprise an odd number of sectors, the banks contain different numbers of sectors, and the memory system comprises a total number of rows that is not a power of 2. In this example, there are 4 banks and 17 sectors, with each sector including 2 rows. Here, bank 901 is allocated 5 sectors, and banks 902, 903, and 904 are respectively allocated 4 sectors. Because each sector has 2 rows, the least significant bit, XA[0], is used to decode the row within each sector. That is, because a sector contains two rows, XA[0]=0 will indicate one row and XA[0]=1 will indicate the other row. It is desirable for sense amplifier and column drivers 909 and 910 to have balanced top and bottom bitlines. Hence, if the top bank, such as bank 901, contains 5 sectors, then it is desirable for the bottom bank, such as bank 903, to contain 5 sectors as well. Because bank 901 contains 5 sectors and bank 903 contains 4 sectors, dummy sector 921 is added to bank 903. Dummy sector 921 is not used to store data.

Memory system 900 comprises logical array 950 formed of banks 901, 902, 903, and 904. Memory system 900 further comprises column multiplexors 905, 906, 907, and 908; sense amplifiers and column drivers 909 and 910; row decoders 911, 912, 913, and 914; and high voltage decoders and latches 915, 916, 917, 918, 919, and 920. Banks 901, 902, 903, and 904 respectively comprise an array of non-volatile memory cells arranged into rows and columns. The non-volatile memory cells can be split-gate flash memory cells such as memory cells 110, 210, and 310 in FIGS. 1, 2, and 3, respectively, or stacked-gate flash memory cells such as memory cell 410 in FIG. 4. Bank 901 comprises sectors 0, 1, 2, 3, and 4; bank 902 comprises sectors 9, 10, 11, and 12; bank 903 comprises sectors 5, 6, 7, 8, and dummy sector 921; and bank 904 comprises sectors 13, 14, 15, and 16.

Column multiplexor 905 operates on columns of bank 901, column multiplexor 906 operates on columns of bank 902, column multiplexor 907 operates on columns of bank 903, and column multiplexor 908 operates on columns of bank 904.

Row decoder 911 operates on the rows of bank 901 corresponding to sectors 0, 1, 2, and 3 and on the rows of bank 902 corresponding to sectors 9, 10, 11, and 12; row decoder 913 operates on the rows of bank 901 corresponding to sector 4; and row decoder 912 operates on the rows of bank 903 corresponding to sectors 5, 6, 7, and 8 and on the rows of bank 904 corresponding to sectors 13, 14, 15, and 16. Row decoder 914 corresponds to the rows of bank 903 corresponding to dummy sector 921. Row decoder 914 is optional and is included to allow for the possibility that dummy sector 921 could be converted into a normal sector used to store and retrieve data.

Sense amplifier and column driver 909 performs sense operations on outputs received from column multiplexors 905 and 907 during read operations and controls current applied to the columns of bank 901 and 903 through column multiplexors 905 and 907 during programming operations. Sense amplifier and column driver 910 performs sense operations on outputs received from column multiplexors 906 and 908 during read operations and controls current applied to the columns of bank 902 and 904 through column multiplexors 906 and 908 during programming operations.

HV decoder and latch 915 provides high voltages (for example, for program or erase operations) to the rows of bank 901 corresponding to sectors 0, 1, 2, and 3; HV decoder and latch 916 provides high voltages to the rows of bank 902 corresponding to sectors 9, 10, 11, and 12; HV decoder and latch 917 provides high voltages to the rows of bank 903 corresponding to sectors 5, 6, 7, and 8; HV decoder and latch 918 provides high voltages to the rows of bank 904 corresponding to sectors 13, 14, 15, and 16; and HV decoder and latch 919 provides high voltages to the rows of bank 901 corresponding to sector 4. HV decoder and latch 920 corresponds to the rows of bank 903 corresponding to dummy sector 921. HV decoder and latch 920 is optional and is included to allow for the possibility that dummy sector 921 could be converted into a normal sector used to store and retrieve data. In FIG. 9, the sector numbers are global sector numbers, meaning a unique number identifying a sector among all sectors in all banks.

Table No. 8 depicts a bank allocation scheme implemented by row decoders 911, 912, 913, and 914 for this example.

decoders 911, 912, 913, and 914 in FIG. 9. Row address 1001 comprises r bits and is provided to row decoder 1002 (which, as indicated, is an example of row decoders 811, 813, 813, and 814 in FIG. 8 and row decoders 911, 912, 913, and 914 in FIG. 9), and row decoder 1002 asserts various control signals corresponding to a sector, bank, and row identified by row address 1001.

Under address decoding scheme 1000, the t least significant bits in row address 1001 identify a row within a sector, the u next least significant bits in row address 1001 identify a bank within the memory system, and the v next least significant bits in row address 1001 identify a sector within a bank, where t+u+v≤r (for example, one or more bits in the r bits could be used for another purpose). Generally, if the system comprises m banks of non-volatile memory cells,

TABLE NO. 8

Bank Allocation for 34 Rows

| XA[5] | XA[4] | XA[3] | XA[2] | XA[1] | XA[0] | Physical Row # | Logical Row # | Sector # Within Bank | Global Sector # | Bank # |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 1 | 1 | 1 | 0 | 0 | 0 |
| 0 | 0 | 1 | 0 | 0 | 0 | 2 | 8 | 1 | 1 | 0 |
| 0 | 0 | 1 | 0 | 0 | 1 | 3 | 9 | 1 | 1 | 0 |
| 0 | 1 | 0 | 0 | 0 | 0 | 4 | 16 | 2 | 2 | 0 |
| 0 | 1 | 0 | 0 | 0 | 1 | 5 | 17 | 2 | 2 | 0 |
| 0 | 1 | 1 | 0 | 0 | 0 | 6 | 24 | 3 | 3 | 0 |
| 0 | 1 | 1 | 0 | 0 | 1 | 7 | 25 | 3 | 3 | 0 |
| 1 | 0 | 0 | 0 | 0 | 0 | 8 | 32 | 4 | 4 | 0 |
| 1 | 0 | 0 | 0 | 0 | 1 | 9 | 33 | 4 | 4 | 0 |
| 0 | 0 | 0 | 0 | 1 | 0 | 10 | 2 | 0 | 5 | 1 |
| 0 | 0 | 0 | 0 | 1 | 1 | 11 | 3 | 0 | 5 | 1 |
| 0 | 0 | 1 | 0 | 1 | 0 | 12 | 10 | 1 | 6 | 1 |
| 0 | 0 | 1 | 0 | 1 | 1 | 13 | 11 | 1 | 6 | 1 |
| 0 | 1 | 0 | 0 | 1 | 0 | 14 | 18 | 2 | 7 | 1 |
| 0 | 1 | 0 | 0 | 1 | 1 | 15 | 19 | 2 | 7 | 1 |
| 0 | 1 | 1 | 0 | 1 | 0 | 16 | 26 | 3 | 8 | 1 |
| 0 | 1 | 1 | 0 | 1 | 1 | 17 | 27 | 3 | 8 | 1 |
| 0 | 0 | 0 | 1 | 0 | 0 | 18 | 4 | 0 | 9 | 2 |
| 0 | 0 | 0 | 1 | 0 | 1 | 19 | 5 | 0 | 9 | 2 |
| 0 | 0 | 1 | 1 | 0 | 0 | 20 | 12 | 1 | 10 | 2 |
| 0 | 0 | 1 | 1 | 0 | 1 | 21 | 13 | 1 | 10 | 2 |
| 0 | 1 | 0 | 1 | 0 | 0 | 22 | 20 | 2 | 11 | 2 |
| 0 | 1 | 0 | 1 | 0 | 1 | 23 | 21 | 2 | 11 | 2 |
| 0 | 1 | 1 | 1 | 0 | 0 | 24 | 28 | 3 | 12 | 2 |
| 0 | 1 | 1 | 1 | 0 | 1 | 25 | 29 | 3 | 12 | 2 |
| 0 | 0 | 0 | 1 | 1 | 0 | 26 | 6 | 0 | 13 | 3 |
| 0 | 0 | 0 | 1 | 1 | 1 | 27 | 7 | 0 | 13 | 3 |
| 0 | 0 | 1 | 1 | 1 | 0 | 28 | 14 | 1 | 14 | 3 |
| 0 | 0 | 1 | 1 | 1 | 1 | 29 | 15 | 1 | 14 | 3 |
| 0 | 1 | 0 | 1 | 1 | 0 | 30 | 22 | 2 | 15 | 3 |
| 0 | 1 | 0 | 1 | 1 | 1 | 31 | 23 | 2 | 15 | 3 |
| 0 | 1 | 1 | 1 | 1 | 0 | 32 | 30 | 3 | 16 | 3 |
| 0 | 1 | 1 | 1 | 1 | 1 | 33 | 31 | 3 | 16 | 3 |

In this example, XA[2:1] is used to identify the bank, XA[5:3] is used to identify the sector within the bank (where each sector within a bank is also assigned a global sector number that is a sector number across all banks), and XA[0] is used to identify the row within the sector. Notably, no additional combinatorial logic is required to identify a bank from the row address; the decoding is performed by row decoders 911, 912, 913, and 914.

Figure 10:
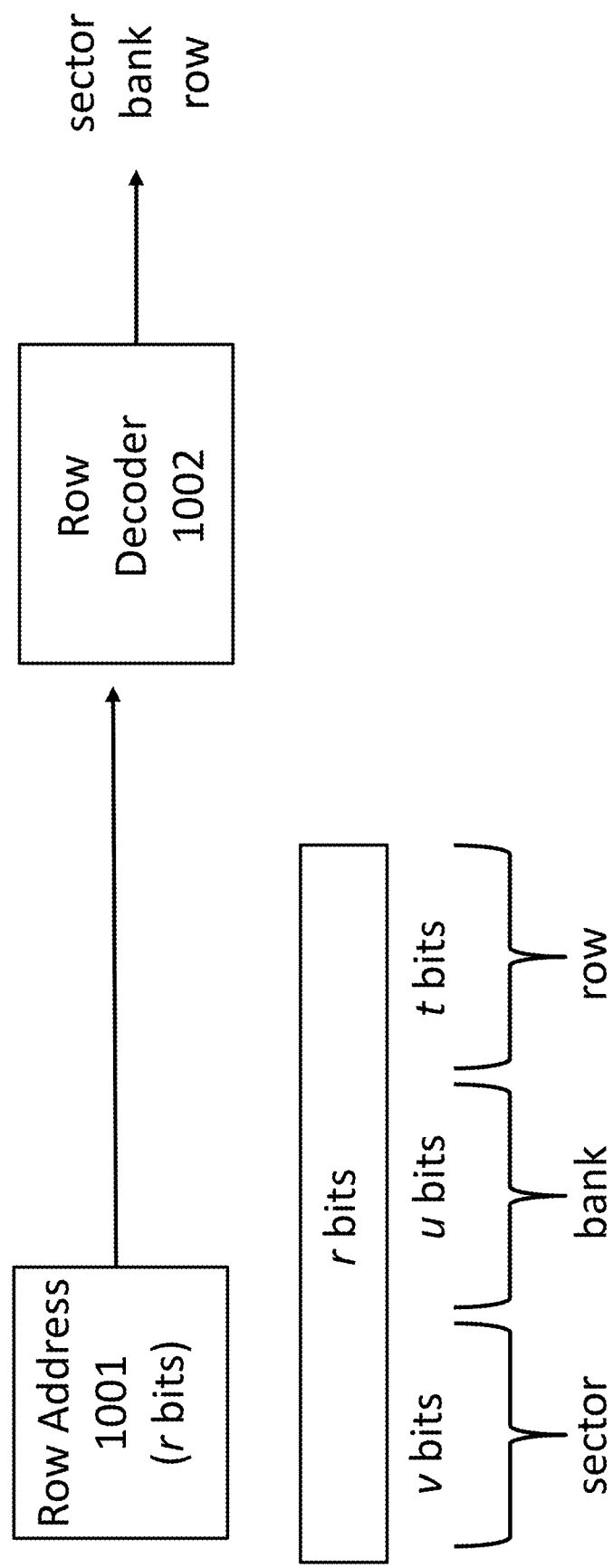
FIG. 10 depicts an address decoding scheme.

FIG. 10 depicts address decoding scheme 1000 implemented by row decoder 1002. In one example, row decoders 811, 813, 813, and 814 in FIG. 8 and row decoders 911, 912, 913, and 914 in FIG. 9 follow address decoding scheme 1000 and are instantiations of row decoder 1002. Thus, row decoder 1002 can operate as row decoders 811, 812, 813, and 814 in memory system 800 in FIG. 8 and as row with respective banks comprising n or fewer sectors, and respective sectors comprising p rows, then the t, u, and v are chosen to satisfy the following conditions:

$m \leq 2^u$ $n \leq 2^v$ $p \leq 2^t$

For example, if m=4, n=5, and p=2 (as in the example of FIG. 8 and Table No. 7), then u=2, v=3, and t=1. This makes sense because 4 banks can be identified by 2 bits (00, 01, 10, and 11), 5 sectors can be identified by 3 bits (e.g., 000, 001, 010, 011, 100), and 2 rows can be identified by 1 bit (0, 1).

Address decoding scheme 1000 is effective for configurations that were not feasible in prior art system, such as configurations where n*p is not a power of 2, where n is an odd number, where banks contain different numbers of sectors, and where the total number of rows is not a power of 2.

Figure 11:
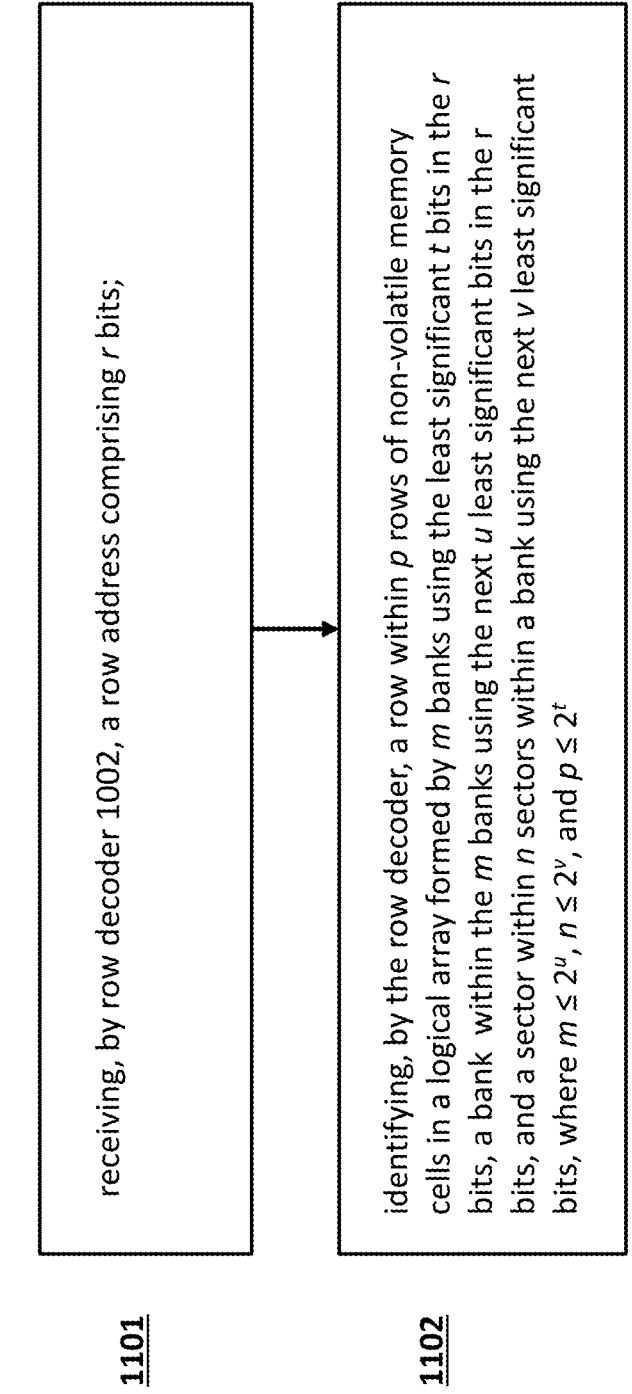
FIG. 11 depicts another address decoding method.

FIG. 11 depicts address decoding method 1100 that can be performed using row decoder 1002 in FIG. 10. The first operation is receiving, by row decoder 1002, a row address comprising r bits (1101). The second operation is identifying, by the row decoder, a row within p rows of non-volatile memory cells in a logical array formed by m banks using the least significant t bits in the r bits, a bank within the m banks using the next u least significant bits in the r bits, and a sector within n sectors within a bank using the next v least significant bits, where $m \leq 2^u$, $n \leq 2^v$, and $p \leq 2^t$ (1102).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory system comprising:
   m banks of non-volatile memory cells, the m banks respectively comprising n or fewer sectors and the sectors respectively comprising p rows; and
   a row decoder to receive a row address comprising r bits and to identify (i) a row using the least significant t bits in the r bits, (ii) a bank using the next u least significant bits, and (iii) a sector using the next v least significant bits, where $m \leq 2^u$, $n \leq 2^v$, and $p \leq 2^t$.

2. The memory system of claim 1, wherein n*p is not a power of 2.

3. The memory system of claim 1, wherein n is an odd number.

4. The memory system of claim 1, wherein the non-volatile memory cells comprise split-gate flash memory cells.

5. The memory system of claim 1, wherein the non-volatile memory cells comprise stacked-gate flash memory cells.

6. The memory system of claim 1, wherein a number of the sectors in a bank is an even number.

7. The memory system of claim 1, wherein a number of the sectors in a bank is an odd number.

8. The memory system of claim 1, wherein a number of sectors in one bank is different than a number of sectors in another bank.

9. The memory system of claim 1, wherein a total number of rows of the memory system is not equal to $2^r$.

10. A method comprising:
    receiving, by a row decoder, a row address comprising r bits; and
    identifying, by the row decoder, a row within p rows of non-volatile memory cells in a logical array formed by m banks using the least significant t bits in the r bits, a bank within the m banks using the next u least significant bits in the r bits, and a sector within n sectors within a bank using the next v least significant bits, where $m \leq 2^u$, $n \leq 2^v$, and $p \leq 2^t$.

11. The method of claim 10, wherein n*p is not a power of 2.

12. The method of claim 10, wherein n is an odd number.

13. The method of claim 10, wherein the non-volatile memory cells comprise split-gate flash memory cells.

14. The method of claim 10, wherein the non-volatile memory cells comprise stacked-gate flash memory cells.

15. The method of claim 10, wherein the number of sectors in a bank is an even number.

16. The method of claim 10, wherein the number of sectors in a bank is an odd number.

17. The method of claim 10, wherein a number of sectors in one bank is different than a number of sectors in another bank.

18. The method of claim 10, wherein the total number of the rows is not equal to $2^r$.

19. A memory system comprising:
    m banks of non-volatile memory cells, the m banks respectively comprising n or fewer sectors, and the sectors respectively comprising p rows; and
    a row decoder to receive a row address comprising r bits and to identify a row using the r bits;
    wherein the total number of rows among the m banks is not a power of 2, and at least two of the m banks comprise different numbers of sectors.

20. The system of claim 19, wherein the row decoder identifies a bank among the m banks using a subset of the r bits.

* * * * *